United States Patent
Bristol et al.

(10) Patent No.: US 10,892,184 B2
(45) Date of Patent: Jan. 12, 2021

(54) PHOTOBUCKET FLOOR COLORS WITH SELECTIVE GRAFTING

(71) Applicant: Intel Corporation, Santa Clara, CA (US)

(72) Inventors: Robert L. Bristol, Portland, OR (US); Kevin L. Lin, Beaverton, OR (US); James M. Blackwell, Portland, OR (US); Rami Hourani, Portland, OR (US); Eungnak Han, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 16/317,015

(22) PCT Filed: Sep. 30, 2016

(86) PCT No.: PCT/US2016/054742
§ 371 (c)(1),
(2) Date: Jan. 10, 2019

(87) PCT Pub. No.: WO2018/063318
PCT Pub. Date: Apr. 5, 2018

(65) Prior Publication Data
US 2019/0318958 A1    Oct. 17, 2019

(51) Int. Cl.
*H01L 21/768*    (2006.01)
*H01L 21/027*    (2006.01)
*H01L 21/311*    (2006.01)

(52) U.S. Cl.
CPC .... *H01L 21/76816* (2013.01); *H01L 21/0273* (2013.01); *H01L 21/31111* (2013.01);
(Continued)

(58) Field of Classification Search
CPC ......... H01L 21/31144; H01L 21/76883; H01L 21/76801; H01L 21/76897; H01L 21/0273;
(Continued)

(56) References Cited

U.S. PATENT DOCUMENTS

2004/0130035 A1    7/2004   Wu et al.
2008/0296778 A1    12/2008  Roessiger et al.
(Continued)

FOREIGN PATENT DOCUMENTS

KR    10-2010-0089902    8/2010

OTHER PUBLICATIONS

International Preliminary Report on Patentability for International Patent Application No. PCT/US2016/054742, dated Apr. 11, 2019, 7 pgs.
(Continued)

*Primary Examiner* — Jasmine J Clark
(74) *Attorney, Agent, or Firm* — Schwabe, Williamson & Wyatt, P.C.

(57) ABSTRACT

Approaches based on photobucket floor colors with selective grafting for semiconductor structure fabrication, and the resulting structures, are described. For example, a grating structure is formed above an ILD layer formed above a substrate, the grating structure including a plurality of dielectric spacers separated by alternating first trenches and second trenches, grafting a resist-inhibitor layer in the first trenches but not in the second trenches, forming photoresist in the first trenches and in the second trenches, exposing and removing the photoresist in select ones of the second trenches to a lithographic exposure to define a set of via locations, etching the set of via locations into the ILD layer, and forming a plurality of metal lines in the ILD layer, where select ones of the plurality of metal lines includes an
(Continued)

underlying conductive via corresponding to the set of via locations.

21 Claims, 14 Drawing Sheets

(52) U.S. Cl.
CPC .. *H01L 21/31144* (2013.01); *H01L 21/76825* (2013.01); *H01L 21/76837* (2013.01); *H01L 21/76883* (2013.01); *H01L 21/76897* (2013.01)

(58) Field of Classification Search
CPC ......... H01L 21/76837; H01L 21/76808; H01L 21/76825; H01L 23/5226; H01L 21/76816; H01L 23/528; H01L 21/32
See application file for complete search history.

(56) References Cited

U.S. PATENT DOCUMENTS

| | | |
|---|---|---|
| 2010/0090264 A1 | 4/2010 | Moll et al. |
| 2015/0171010 A1 | 6/2015 | Bristol et al. |
| 2015/0179513 A1* | 6/2015 | Myers ............... H01L 21/31144 257/774 |

OTHER PUBLICATIONS

International Search Report and Written Opinion for International Patent Application No. PCT/US2016/054742 dated Jun. 27, 2017, 10 pgs.

* cited by examiner

PHOTOBUCKET FLOOR COLORS WITH SELECTIVE GRAFTING

CROSS-REFERENCE TO RELATED APPLICATION

This patent application is a U.S. National Phase Application under 35 U.S.C. § 371 of International Application No. PCT/US2016/054742, filed Sep. 30, 2016, entitled "PHOTOBUCKET FLOOR COLORS WITH SELECTIVE GRAFTING," which designates the United States of America, the entire disclosure of which is hereby incorporated by reference in its entirety and for all purposes.

TECHNICAL FIELD

Embodiments of the invention are in the field of semiconductor structures and processing and, in particular, approaches based on photobucket floor colors with selective grafting for semiconductor structure fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 5A illustrates a starting point structure for a subtractive via process following deep metal line fabrication;

FIG. 5B illustrates the structure of FIG. 5A following recessing of the metal lines;

FIG. 5C illustrates the structure of FIG. 5B following formation of an inter layer dielectric (ILD) layer;

FIG. 5D illustrates the structure of FIG. 5C following deposition and patterning of a hardmask layer;

FIG. 5E illustrates the structure of FIG. 5D following trench formation defined using the pattern of the hardmask of FIG. 5D;

FIG. 5F illustrates the structure of FIG. 5E following photobucket formation in all possible via locations with selective grafting in alternating locations;

FIG. 5G illustrates the structure of FIG. 5F following via location selection;

FIG. 5H illustrates the structure of FIG. 5G following conversion of the remaining photobuckets to permanent ILD material; and FIG. 5I illustrates the structure of FIG. 5H following metal line and via formation.

DESCRIPTION OF THE EMBODIMENTS

Figure 1A:
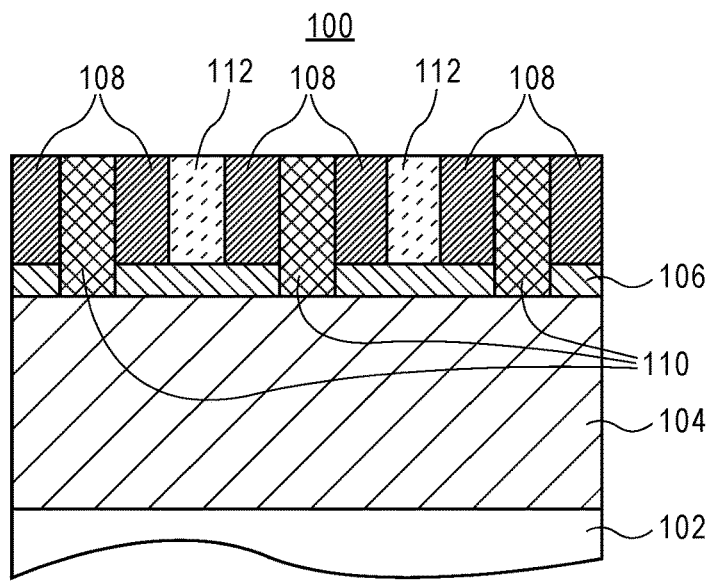
FIGS. 1A-1J illustrate cross-sectional views of various operations in a method of patterning using photobuckets with selective grafting, in accordance with an embodiment of the present invention.

Approaches based on photobucket floor colors with selective grafting for semiconductor structure fabrication, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein is directed to photobucket floor colors with selective grafting. Applications may be directed toward one or more of extreme ultra-violet (EUV) lithography, general lithography applications, solutions for overlay issues (such as edge placement error, EPE), and general photoresist technologies. In an embodiment, materials are described that are suitable for improving performance of so-called "PhotoBucket" based approaches. In such an approach, a resist material is confined to a pre-patterned hardmask. Select ones of the photobuckets are then removed using a high-resolution lithography tool, e.g., an EUV lithography tool. Specific embodiments include use of a material and a process flow to solve issues associated with unwanted via openings caused by lithographic critical dimension (CD) and/or overlay errors. Approaches described herein may be described as involving a selective bottoms-up capping methodology.

To provide context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor or is less of a factor for the resulting structures described herein.

To provide further context, a conventional resist photobucket structure following photobucket development may only partially clear after a mis-aligned exposure. Using a broader exposure window can ensure complete clearance of the selected photobucket, but increases the risk of exposing non-selected neighboring prohotobuckets. Thus, using conventional approaches, constraints regarding exposure size and misalignment tolerance are tight to avoid, if possible, either only partially cleared selected photobuckets with some residual photoresist remaining or opening of non-selected photobucket potentially leading to subsequent formation of conductive structures in unwanted locations.

In accordance with an embodiment of the present invention, approaches described herein involve selective grafting of a resist inhibiting agent to slow down areas of unwanted vias. In contrast to the approaches, fabrication schemes described herein involve the fundamentally different approach of using a selective bottom-up capping methodology. By employing such a selective bottoms-up capping methodology, the need for self-enclosed via structures which otherwise take up metal CD margins may be mitigated. In specific embodiments, processes described herein are more tolerant to edge-placement errors, in which an aerial image does not perfectly align to a photobucket grid. As a result, the select locations are ultimately cleared to provide open photobucket locations following development. The non-selected locations which may also receive some exposure remain as closed photobucket locations following development.

FIGS. 1A-1J illustrate cross-sectional views of various operations in a method of patterning using photobuckets with selective grafting, in accordance with an embodiment of the present invention.

Referring to FIG. 1A, a starting structure 100 for a method of patterning using photobuckets with selective grafting includes an inter-layer dielectric (ILD) layer 104 formed above a substrate 102. A patterned hardmask 106 is formed above the ILD layer 104. A grating structure 108 is above the patterned hardmask 106. In an embodiment, the grating structure 108 includes a plurality of dielectric spacer features patterned using a pitch division patterning scheme, such as pitch halving or pitch quartering process schemes.

A dielectric backbone material 112 is between first alternating pairs of neighboring dielectric spacer features of the grating structure 108. In an embodiment, the dielectric backbone material 112 is first formed, and dielectric spacer features of the grating structure 108 are then formed as sidewall features of the dielectric backbone material 112. In one such embodiment, the dielectric spacer features of the grating structure 108 are formed using a conformal deposition and subsequent anisotropic etching process.

A fill material 110 is between second alternating pairs of neighboring dielectric spacer features of the grating structure 108. The fill material 110 is formed within openings of the patterned hardmask 106. In an embodiment, in the case that the dielectric backbone material 112 is first formed, and dielectric spacer features of the grating structure 108 are then formed as sidewall features of the dielectric backbone material 112, the patterned hardmask layer is formed by patterning through the exposed regions not covered by the dielectric backbone material 112 and the dielectric spacer features of the grating structure 108, e.g., by an etch process. The fill material 110 is then formed within the openings of the patterned hardmask 106 and a planarization process may then be performed to provide the structure 100.

In an embodiment, the materials of the ILD layer 104, the patterned hardmask 106, the dielectric spacer features of the grating structure 108, the dielectric backbone material 112, and the fill material 110 differ in composition from one another. In an embodiment, the materials of the ILD layer 104, the patterned hardmask 106, the dielectric spacer features of the grating structure 108, the dielectric backbone material 112, and the fill material 110 differ in etch selectivity from one another. In a specific embodiment, the ILD layer 104 is a low-k dielectric layer, such as a carbon-doped oxide material or other silicon oxide based material, the patterned hardmask 106 is a silicon nitride material, the dielectric spacer features of the grating structure 108 are a carbon-doped silicon nitride material, the dielectric backbone material 112 is an amorphous silicon material, and the fill material 110 is a resist-based fill material such as an organic polymer material. Although the layers 106, 108, 110 and 112 are depicted as being formed directly on the ILD layer 104 in structure 100, in other embodiments, a blanket hardmask layer is included between the layers 106, 108, 110 and 112 are depicted as being formed directly on the ILD layer 104.

Figure 1B:
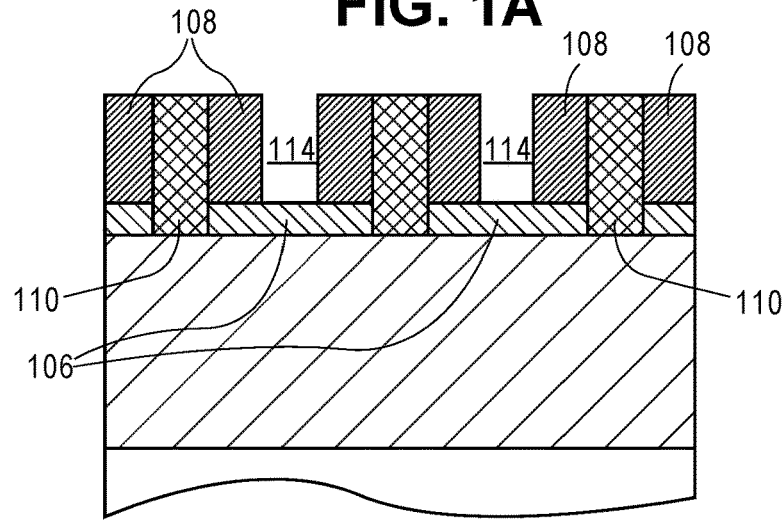

Referring to FIG. 1B, the dielectric backbone material 112 is removed from the structure of FIG. 100 of FIG. 1A. Upon removing the dielectric backbone material 112, trenches 114 are formed between the first alternating pairs of neighboring dielectric spacer features of the grating structure 108. The trenches 114 expose portions of the patterned hardmask 106. In an embodiment, the dielectric backbone material 112 is removed using a selective etch process, such as a selective wet etch process or a selective dry etch process. In one embodiment, the fill material 110 is included in the structure 100 in order to protect surfaces of the ILD layer 106 during the removal of the dielectric backbone material 112.

Figure 1C:
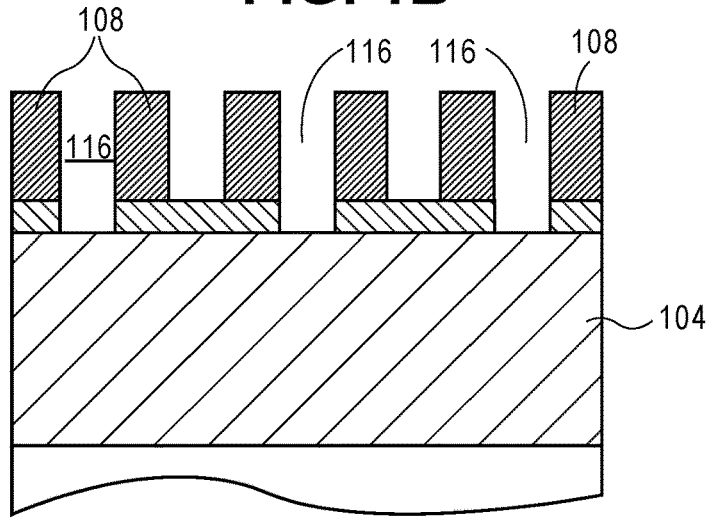

Referring to FIG. 1C, the fill material 110 is removed from the structure of FIG. 1B. Upon removing the fill material 110, trenches 116 are formed between the second alternating pairs of neighboring dielectric spacer features of the grating structure 108. The trenches 116 expose portions of the ILD layer 104. In an embodiment, the fill material 110 is removed using a selective etch process, such as a selective wet etch process or a selective dry etch process. In one embodiment, the fill material 110 is removed using an etch process that is non-damaging or minimally damaging to the underlying portions of the surface of the ILD layer 104.

Figure 1D:
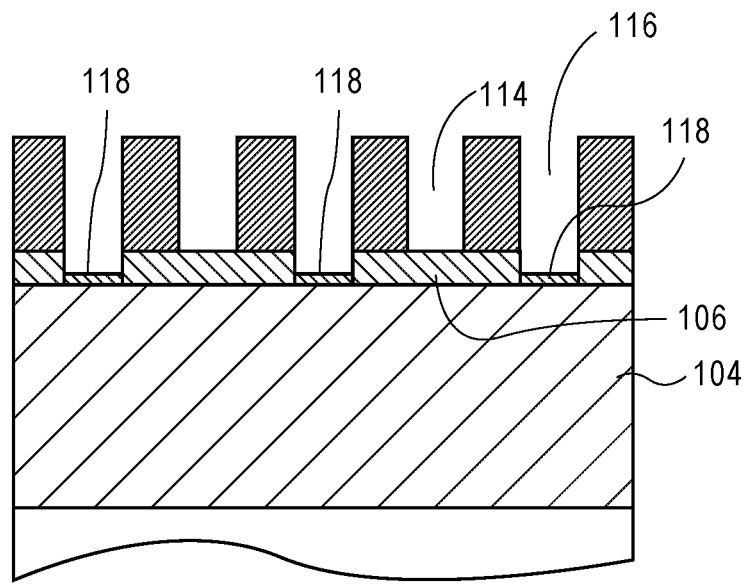

Referring to FIG. 1D, a resist inhibitor layer 118 is selectively grafted on the portions of the surface of the ILD layer 104 exposed by trenches 116 without being formed on the portions of the surface of the patterned hardmask exposed by trenches 114. Accordingly, in an embodiment, the grafted resist inhibitor layer 118 is only formed between the formed between the second alternating pairs of neighboring dielectric spacer features of the grating structure 108 and not between the first alternating pairs of neighboring dielectric spacer features of the grating structure 108.

In an embodiment, the grafting of the grafted resist inhibitor layer 118 is performed using a selective deposition process. In one embodiment, selective grafting is performed by first spinning-on material over the entire structure of FIG. 1D and then "washing away" material that does not adhere to the select locations, e.g., the bottoms of trenches 116. In another embodiment, selective growth is performed only in the select locations at the bottoms of trenches 116, e.g., using a chemical vapor deposition (CVD) or atomic layer deposition (ALD) process.

In an exemplary embodiment, the three surfaces exposed in the structure of FIG. 1D include a dielectric spacer material of grating structure 108 that is a material without hydroxyl groups. The patterned hardmask layer 106 is a metal nitride or a metal oxide. The ILD material 104 is a silicon based dielectric with exposed Si—OH groups at the surface. In accordance with an embodiment of the present invention, the grafted resist inhibitor layer 118 is or includes grafting agents which (a) do not graft to the spacer material of grating structure 108 due to lack of surface hydroxyl groups or other functionality in the grating structure 108, (b) bind weakly or not at all to metal nitride or metal oxide surfaces or can be easily removed thermally or with a rinse operation, and (c) bind strongly to Si—OH groups through formation of new Si—O—Si interactions or other groups. In a specific such embodiment, the grafted resist inhibitor layer 118 delivers a basic molecule or moiety connected to the attachment group, context for which is described in greater detail below.

In an exemplary embodiment, examples of the types of molecules that can be used to target Si—OH containing surfaces selectively versus metal oxide or metal nitride surfaces include alkoxysilanes or aminosilanes. Examples that also deliver a quenching molecule or a base include 3-aminiopropyldimethyldimethylaminosilane, 3-aminopropyltriethoxysilane, or 2-pyridylethyltriethoxysilane.

Figure 1E:
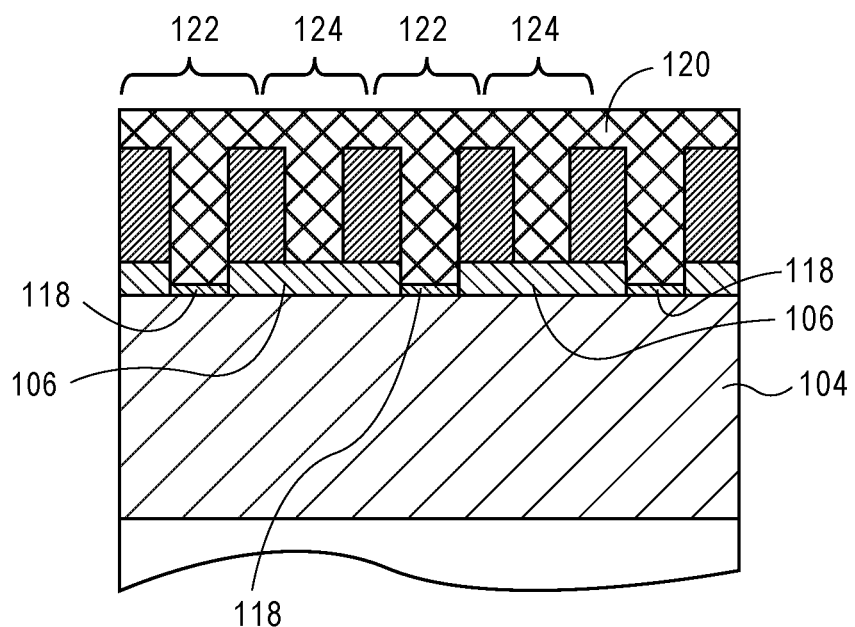

Referring to FIG. 1E, a photoresist layer 120 is formed over the structure of FIG. 1D. In an embodiment, the photoresist layer 120 is formed within the trenches 114 and the trenches 116 and over the dielectric spacer features of the grating structure 108 with a planar or substantially planar uppermost surface. In one embodiment the photoresist layer 120 is formed over the structure of FIG. 1D using a spin-on process. In an embodiment, the photoresist layer 120 includes alternating inhibited regions 122 and non-inhibited regions 124, as is depicted in FIG. 1E. In one such embodiment, the inhibited regions 122 are those portions of the photoresist layer 120 affected or treated by the grafted resist inhibitor layer 118 in the trenches 116. The non-inhibited regions 124 are those portions of the photoresist layer 120 not affected or treated by the grafted resist inhibitor layer 118. In a specific such embodiment, non-inhibited regions 124 are those portions of the photoresist layer 120 in the trenches 114.

In an embodiment, the photoresist layer 120 has a photolyzable composition. In one such embodiment, the photolyzable composition includes an acid-deprotectable photoresist material. In an embodiment, a photo-acid generator (PAG) component is included and, in a specific embodiment, includes a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate, or other examples containing —SO3 sulfonate anion bound to organic group. In an embodiment, the acid-deprotectable photoresist material is an acid-deprotectable material selected from the group consisting of a polymer, a molecular glass, a carbosilane and a metal oxide. In an embodiment, the acid-deprotectable photoresist material includes a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking. In another embodiment, the photolyzable material is not a photo-acid generator (PAG)-based photolyzable material. In an embodiment, the photolyzable material is a negative tone material.

In an embodiment, the grafted resist inhibitor layer 118 is a base or includes a basic component to counter a generated acid in an exposed photoresist material based on a PAG. The grafted resist inhibitor layer 118 may also be referred to as a quencher in that the grafted resist inhibitor layer 118 effectively quenches the effect of any exposure to photoresist in locations that are not selected from removal, as is described below. In an embodiment, since high contrast photoresists operate in an on/off mode, the amount of quencher delivered to each bucket is sufficiently different to move contrast curves in one direction and not the other.

Figure 1F:
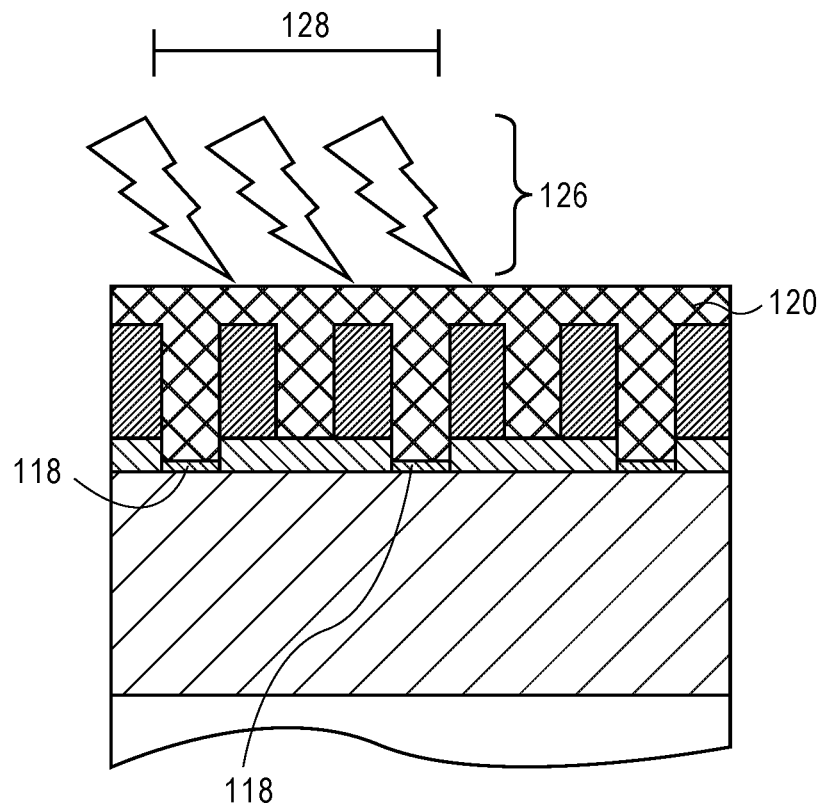

Referring to FIG. 1F, a portion of the structure of FIG. 1E are exposed to a lithography exposure 126. In an embodiment, the lithography exposure 126 is performed using a relatively large exposure window 128. For example, in one embodiment, a trench in the center of the exposure window 128 is selected as a via location for ultimate photobucket clearance. Neighboring trenches would otherwise be exposed and cleared by the large exposure window 128. However, even though the neighboring trenches are exposed, they are not opened upon eventual development because they are trenches including the grafted resist inhibitor layer 118, as is depicted in FIG. 1F.

In an embodiment, the lithography exposure 126 involves exposing the structure to extreme ultraviolet (EUV) or e-beam radiation. In an embodiment, the EUV or e-beam radiation has a wavelength approximately 13.5 nanometers. In another embodiment, exposing the structure to extreme ultraviolet (EUV) or e-beam radiation includes exposing the structure to energy in the range of 5-150 keV. In an embodiment, exposing the structure to UV radiation includes exposing the structure to energy having a wavelength approximately 365 nanometers.

In an embodiment, subsequent to the lithography exposure 126, a bake operation is performed. In one such embodiment, the bake is performed at a temperature approximately in the range of 50-120 degrees Celsius for a duration of approximately in the range of 0.5-5 minutes.

Figure 1G:
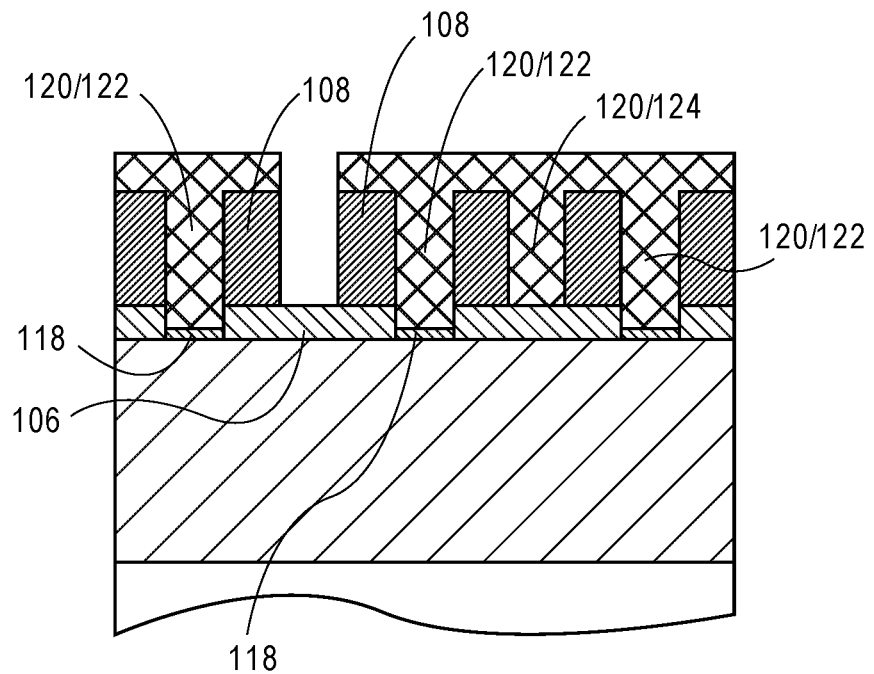

Referring to FIG. 1G, the structure of FIG. 1F is exposed to a development process. The development process clears the exposed trench that did not include the grafted resist inhibitor layer 118 and, as such, was a non-inhibited region 124 of the photoresist layer 120. The immediately neighboring trenches include the grafted resist inhibitor layer 118 and, as such, are inhibited regions 122 of the photoresist layer 120. In an embodiment, the neighboring trenches do not clear upon development even though at least portions of the photoresist layer 120 in the neighboring trenches were exposed to the lithography exposure 126 performed using the relatively large exposure window 128.

In an embodiment, developing the structure of FIG. 1F includes, in the case of positive tone development, immersion or coating with standard aqueous TMAH developer (e.g., in a concentration range from 0.1M-1M) or other aqueous or alcoholic developer based on tetraalkylammonium hydroxides for 30-120 seconds followed by rinse with deionized (DI) water. In another embodiment, in the case of negative tone development, developing the structure includes immersion or coating with organic solvents such as cyclohexanone, 2-heptanone, propylene glycol methylethyl acetate or others followed by rinse with another organic solvent such as hexane, heptane, cyclohexane or the like.

Figure 1H:
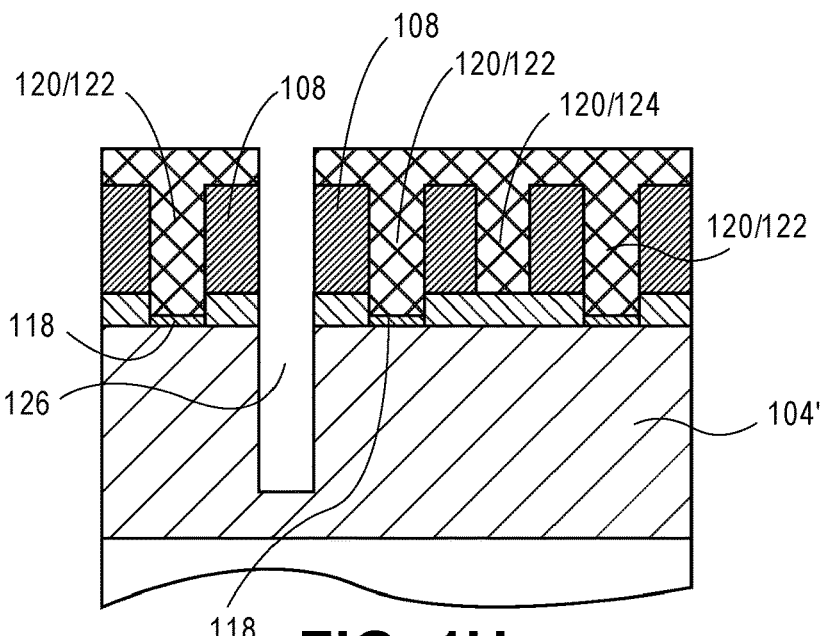

Referring to FIG. 1H, the structure of FIG. 1G is exposed to an etch process used to form a trench 126 to form patterned dielectric layer 104'. In one embodiment, the trench 126 represents an eventual interconnect line location having an associated underlying via. Accordingly, the etch process used to form trench 126 is, in one embodiment, a via selection process based on selection and removal of a photobucket.

Figure 1I:
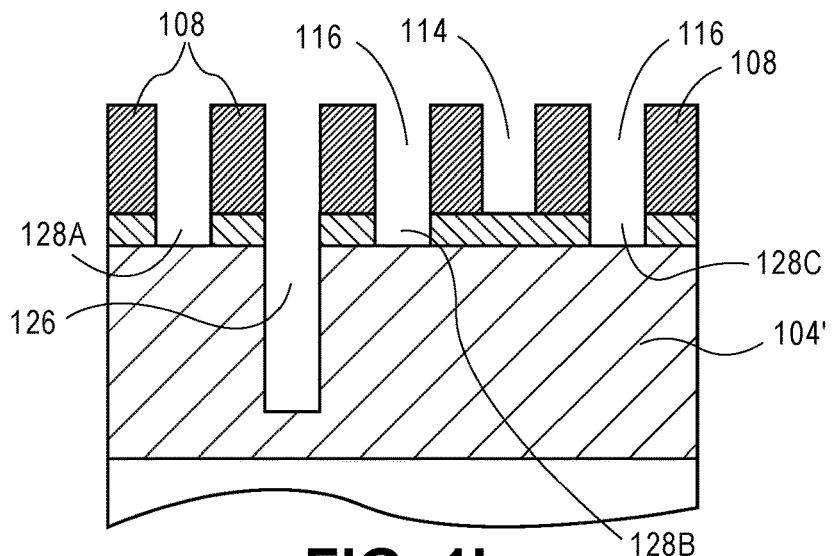

Referring to FIG. 1I, subsequent to forming the trench 126, remaining portions of the photoresist layer 120 are removed from the structure of FIG. 1G, leaving re-opened trenches 114 and 116. Additionally, in an embodiment, the grafted resist inhibitor layer 118 is also removed from re-opened trenches 116.

Figure 1J:
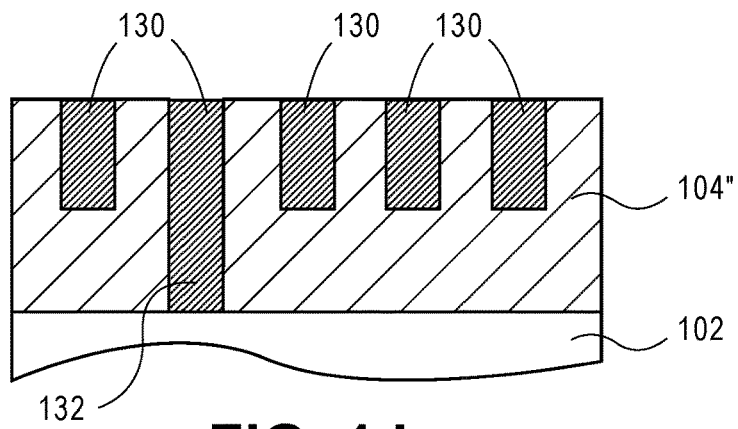

At this stage, in an embodiment, via selection is complete. Referring to FIG. 1J, then, trenches are formed in patterned dielectric layer 104' to form twice patterned dielectric layer 104". In an embodiment, a dry etch process is used to pattern twice-patterned dielectric layer 104". Twice-patterned dielectric layer 104" includes trenches formed through locations of remaining trenches 114 and 116 of FIG. 1I. Additionally, twice-patterned dielectric layer 104" includes a fully extended trench formed by extending trench 126 from FIG. 1J through to the bottom of twice-patterned dielectric layer 104", as is depicted in FIG. 1J. Subsequently, metal lines 130 and conductive vias 132 are formed in the twice-patterned dielectric layer 104", e.g., by a metal deposition and subsequent planarization process. Additionally, in an embodiment, the remaining portions of patterned hardmask 106 and dielectric spacers of the grating structure 108 are removed, e.g., by a wet cleans removal performed prior to forming the metal lines 130 and conductive vias 132.

Referring again to FIG. 1I, in another embodiment, prior to performing the metallization process of FIG. 1J, a second via selection process is performed. For example, in one embodiment, a second selected grating resist inhibitor process is performed to select a second set of via locations at one or more of locations 128A, 128B or 128C of FIG. 1I. In an embodiment, instead of forming a grafted resist inhibitor layer 118 at the bottom of trenches 116, a different resist inhibitor is grafted at the bottoms of remaining trenches 114. In one such embodiment, since the bottom of trenches 114 include an exposed portion of patterned hardmask 106 instead of an exposed surface of ILD layer 104, a different chemical compatibility is selected to graft a resist inhibit onto the surfaces of the exposed patterned hardmask 106 at the bottom of remaining trenches 104. Subsequently, operation complementary to the operations described above in association with FIGS. 1E-1I are performed to form via locations in addition to via location determined by trench 126. Once the second via selection process is performed, a metallization structure such as described in association with FIG. 1J (with additional vias 132, including possible via locations at sites immediately neighboring the via of FIG. 1J) may be fabricated.

In an exemplary embodiment for a second grafting process following the exemplary embodiment for the first grafting process described above, a second grafted resist inhibitor is or includes grafting agents that (a) do not graft to the dielectric spacer material of the grating structure 108 due to lack of surface hydroxyl groups or other functionality in the grating structure 108, (b) bind weakly or not at all to silicon hydroxyl groups or can be removed thermally or with a gentle rinse operation, and (c) bind strongly to metal oxide or metal nitride surfaces such as $HfO_2$, $Al_2O_3$, TiN. In a specific such embodiment, the second grafted resist inhibitor delivers a basic molecule or moiety connected to the attachment group, as is described above for grafted resist inhibitor layer 118.

In an exemplary embodiment, the second grafted resist inhibitor is a phosphonic acid. Phosphonic acids are known to coordinate to metal surfaces much more strongly and extensively than to silicon oxide type surfaces. In one embodiment, then, molecules for the second grafted inhibitor include phosphonic acid or a protected phosphonate attachment group and a tail group consisting of amino group, pyridine or other basic functionality.

In either case, whether one or two grafting operations are performed, the structure of FIG. 1J may subsequently be used as a foundation for forming subsequent metal line/via and ILD layers. Alternatively, the structure of FIG. 1J may represent the final metal interconnect layer in an integrated circuit. It is to be appreciated that the above process operations may be practiced in alternative sequences, not every operation need be performed and/or additional process operations may be performed.

It is to be appreciated that the process scheme described in association with FIGS. 1A-1J may represent a one-dimensional (1D) or a two-dimensional (2D) photobucket approach. For example, in a 1D photobucket approach, lines of the grating structure 108 extend without interruption over a long region. By contrast, in a 2D photobucket approach, lines of the grating structure 108 are interrupted at intervals at approximately the same pitch as the pitch of the lines of the grating structure 108.

Figure 2:
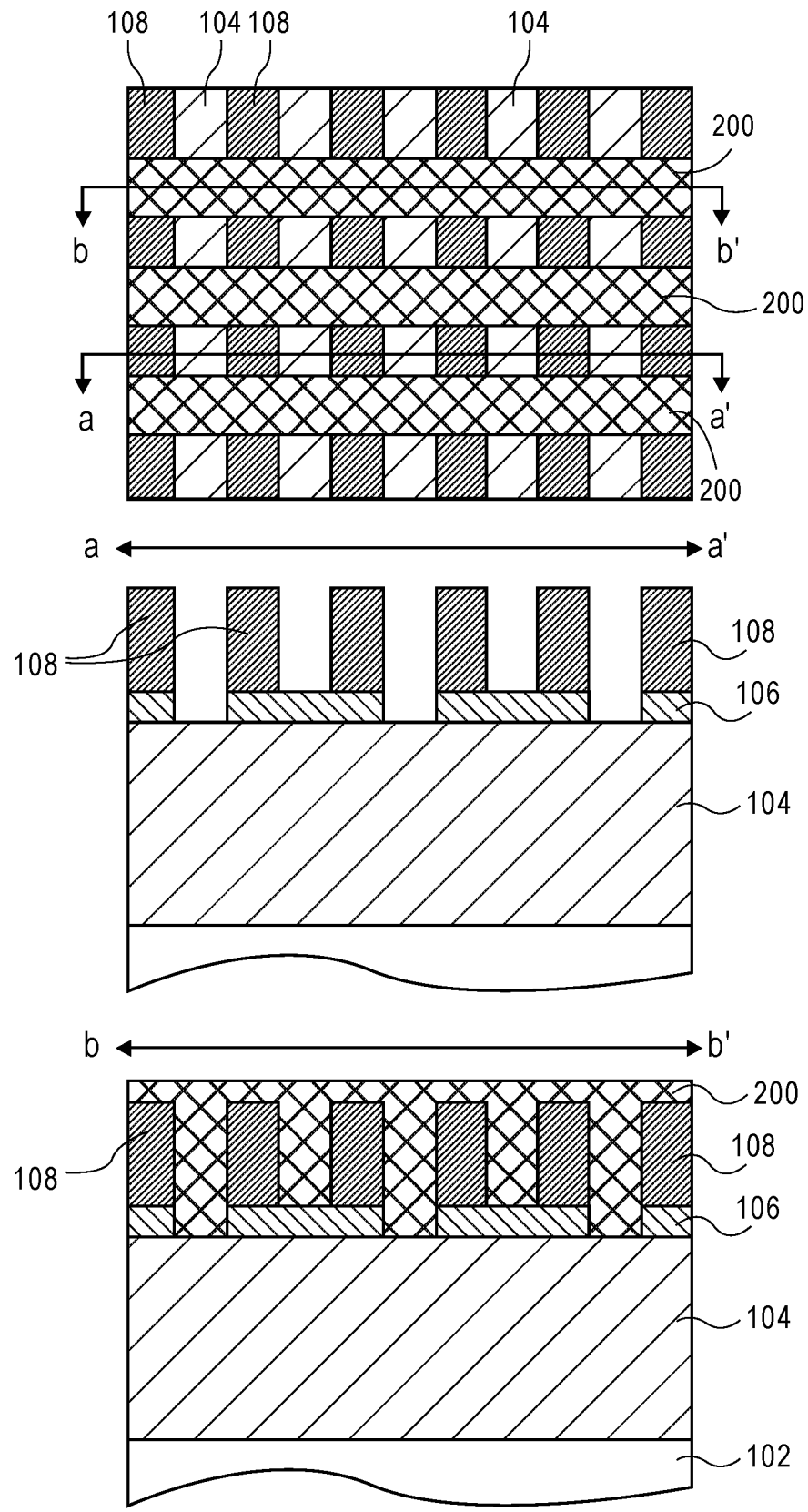
FIG. 2 illustrates a plan view and corresponding cross-sectional views of a 2-dimensional structure for patterning using photobuckets with selective grafting, in accordance with an embodiment of the present invention.

As an example, FIG. 2 illustrates a plan view and corresponding cross-sectional views of a 2-dimensional structure for patterning using photobuckets with selective grafting, in accordance with an embodiment of the present invention. Referring to FIG. 2, the cross-sectional view taken along the a-a' axis represents the same cross-section view of FIG. 1C. However, as seen in the plan view and the corresponding cross-sectional view taken along the b-b' axis of FIG. 2, a cross-grating structure 200 is formed at intervals along the grating structure 108. In one embodiment, the cross-grating structure 200 is a hardmask layer that effectively confines photobucket locations at intervals along the grating structure 108. In an embodiment, the structure of FIG. 2 is subjected to operations described in association with FIGS. 1D-1J to form vias that have locations confined two dimensions.

In an embodiment, whether a 1D or 2D approach is used, approaches described herein involve the fabrication of regular structures covering all possible feature locations, such as all possible via locations, followed by selective patterning of only the desired or select features. In an embodiment, resist-inhibitor material may remain in the final structure at the corners of the metal lines 130 underneath any mis-landed vias.

Referring again to FIGS. 1A-1J and 2, it is to be appreciated that specific grafting chemistry will depend on details of the surfaces exposed at time of grafting. Additionally, in an embodiment, selectivity does not need to be complete at each operation. For example, the amount of quencher or other resist-inhibiting agent needs to be greater in one set of buckets relative to the other, but can actually be present at both locations. It is to be further appreciated that the relative effect on the photoresist performance will be dependent on the relative inhibitor amount differential but also on the amount of photo-acid generator (PAG) included in the photoresist layer 120, post exposure bake (PEB) temperatures, developer conditions, etc.

In accordance with another embodiment of the present invention, in addition to or in place of delivering a resist-inhibiting agent selectively to desired buckets, similar chemistry can be used to deliver resist-enhancing agents to desired buckets. For example, a PAG or weak acid or other agent can be included to provide a resist within a bucket that has an advantage over a resist in a bucket with less of such an agent. The same attachment strategies described above may be used for quenchers. The two approaches could be used in parallel where one grafting group selectively attaches quencher in one bucket population (e.g., silane grafting agent on ILD) and a second grafting group attaches PAG/acid in second population (e.g., phosphonic acid grafting agent on metal oxide/nitride).

In accordance with another embodiment of the present invention, selective grafting of resist inhibitors can be engineered by selectively depositing a sacrificial blocking layer, such as a self-assembled monolayer (SAM) on the surface where it is required. The selectivity of the grafting will depend on the type of material on which it is formed. Some SAM chemistries will selectively graft to an exposed ILD surface and can be fabricated from silane chemistries such as chloro-, alkoxy-, and amino silanes with long alkane (octadecyl trichlorosilane, trimethoxy(octadecyl)silane, etc) or fluorocarbon (triethoxy(3,3,4,4,5,5,6,6,7,7,8,8,9,9,10,10,10-heptadecafluorodecyl, 1-(3,3,4,4,5,5,6,6,7,7,8,8,9,9,10,10,10-heptadecafluorodecyl)-N,N,N',N',N'',N''-hexamethylsilanetriamine, etc.) silane, chains.

In an embodiment, if the selectivity of such passivation step is not sufficient due to the possible reactivity of the passivant on both hardmask and ILD exposed surfaces, a thermal annealing or wet cleans operations can be used to completely remove any passivant that has reacted on hardmask surfaces while maintaining passivation on ILD surfaces. The resist inhibiting molecules can also be deposited on opposite surface types, if desired. In one such embodiment, a different set of SAM chemistries including but not limited to alkenes, alkynes, amines, phosphines, thiols, phosphonic acids or carboxylic acids may be employed. SAMs may be assembled in the solution or vapor phase using molecules with long (C8-C22) alkyl chains and head groups from all the listed chemistries above. Polymeric materials (C22<), either homopolymer or random copolymer that containing both quenching unit and surface grafting functional group (alkenes, alkynes, amines, phosphines, thiols, phosphonic acids, or carboxylic acids) may also be applied in a similar way.

In another embodiment, a hardmask is not included until final pattern transfer. In one such embodiment, reference above to the first hardmask actually refers to an exposed ILD surface.

In an exemplary embodiment, approaches described above build on approaches using so-called "photobuckets," in which every possible feature, e.g. via, is pre-patterned into a substrate. Then, a photoresist is filled into patterned features and the lithography operation is merely used to choose select vias for via opening formation. In a particular embodiment described below, a lithography operation is used to define a relatively large hole above a plurality of photobuckets that include photoresist and selective grafting in certain photoresist locations, as described above. The colored floor photoresist photobucket approach allows for larger critical dimensions (CD)s and/or errors in overlay while retaining the ability to choose the via of interest.

In general, one or more embodiments are directed to an approach that employs a subtractive technique to ultimately form conductive vias and, possibly, non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

Applications of approaches described herein may be implemented for to create regular structures covering all possible via (or plug) locations, followed by selective patterning of only the desired features. More specifically, one or more embodiments described herein involves the use of a subtractive method to pre-form every via or via opening using the trenches already etched. An additional operation is then used to select which of the vias and plugs to retain. As described above, such operations can be illustrated using "photobuckets," although the selection process may also be performed using a more conventional resist expose and ILD backfill approach.

In another aspect, a selective grafting process is performed using two distinct photoresist deposition process, even though the same photoresist material may be deposited in both distinct operations. Such a two-operation photoresist approach may be used to direct or confine the effects of a photoresist inhibitor al alternating locations in that a break is provided between the photoresist material at neighboring locations. As an example, FIGS. 3A-3G illustrate cross-sectional views of various operations in a method of patterning using photobuckets with selective grafting, in accordance with an embodiment of the present invention.

Figure 3A:
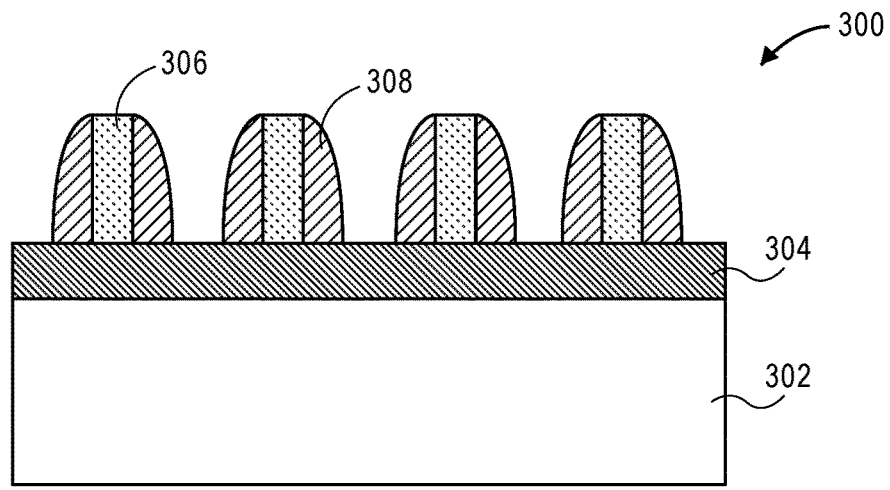
FIGS. 3A-3G illustrate cross-sectional views of various operations in a method of patterning using photobuckets with selective grafting, in accordance with an embodiment of the present invention.

FIG. 3A illustrates a cross-sectional view of a starting structure 300 following deposition, but prior to patterning, of a first hardmask material layer 304 formed on an interlayer dielectric (ILD) layer 302, in accordance with an embodiment of the present invention. Referring to FIG. 3A, a patterned mask 306 has spacers 308 formed along sidewalls thereof, on or above the first hardmask material layer 304.

Figure 3B:
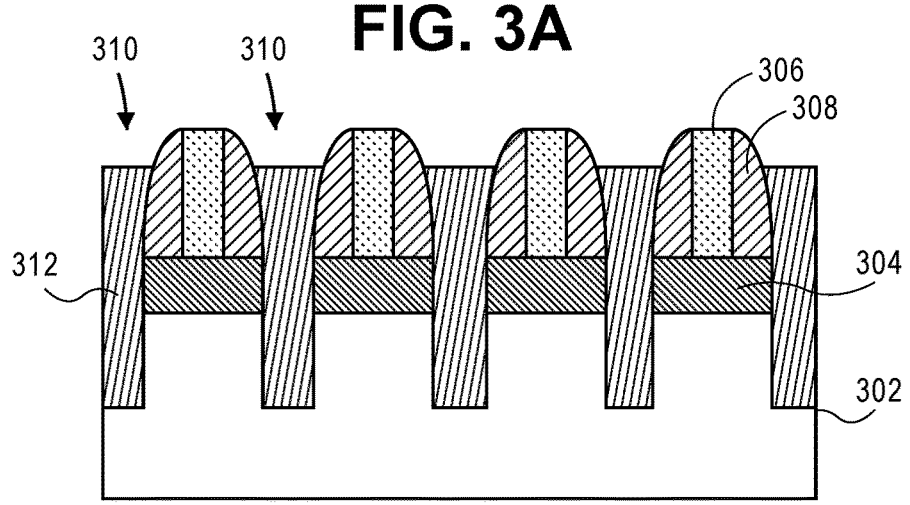

FIG. 3B illustrates the structure of FIG. 3A following first time patterning of the first hardmask layer and subsequent first photobucket fill, in accordance with an embodiment of the present invention. Referring to FIG. 3B, the patterned mask 306 and corresponding spacers 308 are used together as a mask during an etch to form trenches 310 through the first hardmask material layer 304 and partially into the ILD layer 302. The trenches 310 are then filled with first photobuckets 312 which include a photoresist material.

Figure 3C:
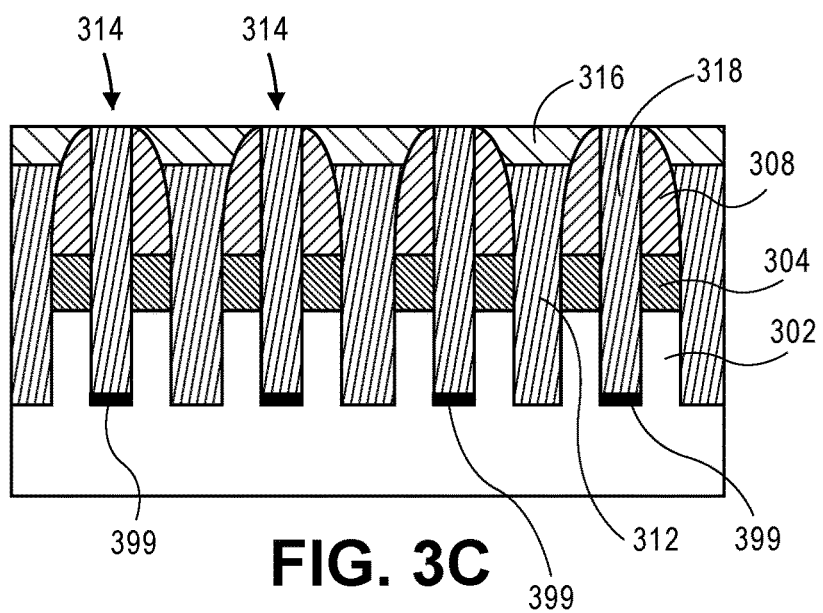

FIG. 3C illustrates the structure of FIG. 3B following second time patterning of the first hardmask layer and subsequent second photobucket fill, in accordance with an embodiment of the present invention. Referring to FIG. 3C, the patterned mask 306 is removed and a second plurality of trenches 314 is etched through the first hardmask material layer 304 and partially into the ILD layer 302, between spacers 308. Subsequently, the trenches 314 are filled with a grafted resist-inhibitor layer 399 and then with second photobuckets 318 which include a photoresist material. In one such embodiment, the second photobuckets 318 and the first photobuckets 312 are filled with the same photoresist material.

Referring again to FIG. 3C, the negative pattern of the spacers 308 is thus transferred, e.g., by two etch processes forming trenches 310 and 314, to the first hardmask material layer 304. In one such embodiment, the spacers 308 and, hence, the trenches 310 and 314 are formed with a grating pattern, as is depicted in FIG. 3C. In an embodiment, the grating pattern is a tight pitch grating pattern. In a specific such embodiment, the tight pitch is not achievable directly through conventional lithography. For example, a pattern based on conventional lithography may first be limited to mask 306, but the pitch may be halved by the use of negative spacer mask patterning, as is depicted in FIGS. 3A-3C. Even further, although not shown, the original pitch may be quartered by a second round of spacer mask patterning. Accordingly, the grating-like pattern of the photobuckets 312 and 318, collectively, is spaced at a constant pitch and has a constant width.

Figure 3D:
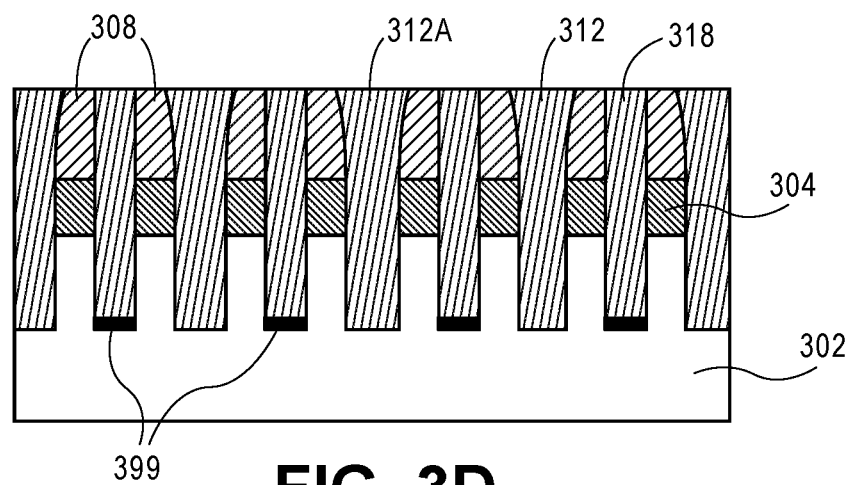

FIG. 3D illustrates the structure of FIG. 3C following planarization to isolate the first and second photobuckets from one another, in accordance with an embodiment of the present invention. Referring to FIG. 3D, the second photobuckets 318 and the top portions of the spacers 308 are planarized, e.g., by chemical mechanical polishing (CMP), until the top surfaces of the first photobuckets 312 are exposed, forming discrete second photobuckets 318. In one embodiment, the combination of first photobuckets 312 and second photobuckets 318 represent all possible via locations in a subsequently formed metallization structure. One of the first photobuckets 312 is labeled as 312A to indicate that it is selected from removal for ultimate via fabrication.

Figure 3E:
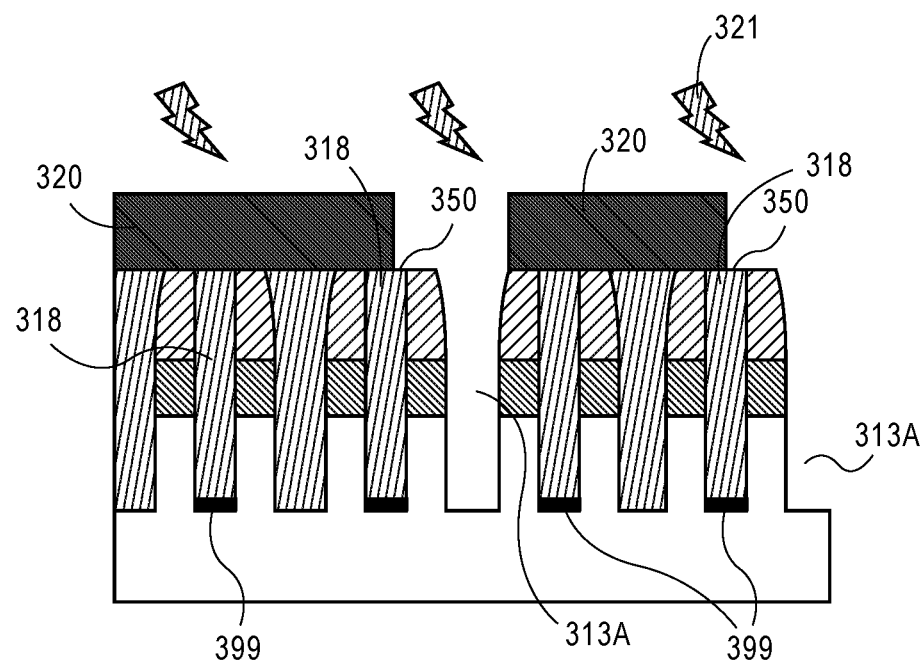

FIG. 3E illustrates the structure of FIG. 3D following exposure and development of two photobuckets to leave selected via locations, in accordance with an embodiment of the present invention. Referring to FIG. 3E, a second hardmask 320 is formed and patterned on the structure of FIG. 3D. The patterned second hardmask 320 reveals two of the first photobuckets 312. The selected photobuckets are exposed to light irradiation, such as an EUV or e-beam exposure 321. It is to be appreciated that description herein concerning forming and patterning a hardmask layer involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a patterned hardmask layer.

In accordance with one embodiment, referring again to FIG. 3E, neighboring one of the second photobuckets 318 are partially exposed, e.g., due to mis-alignment in the patterning of second hardmask 320. In particular, two of the second photobuckets 318 are inadvertently exposed at regions 350, even though they have not been selected as locations for via fabrication. Thus, the selected ones of the first photobuckets 312 are exposed to the EUV or e-beam radiation to a greater extent than the neighboring partially exposed ones of the second photobuckets 318. Subsequent to exposing the structure to EUV or e-beam radiation 321, a first bake of the photobuckets is performed. Subsequent to performing the first bake, the structure is exposed to ultraviolet (UV) radiation. In one embodiment, the mask 320 remains during the UV radiation and is then subsequently removed. However, in another embodiment, the mask 320 is first removed and the photobuckets are then all exposed to the UV radiation to approximately the same extent. In either case, subsequent to exposing the structure to UV radiation, a second bake of the photobuckets is performed.

Referring again to FIG. 3E, the photobuckets are subjected to a develop process. During the develop process, the select one of the first photobuckets 312 targeted for via fabrication are emptied in that the photoresist is removable. However, locations not selected for via fabrication, including the ones of the second photobuckets 318 that were partially exposed at regions 350, are not opened during the develop process, in that the resist material is not removable in the develop process because of the resist-inhibitor layer 399. The developing provides selected via openings 313A.

Figure 3F:
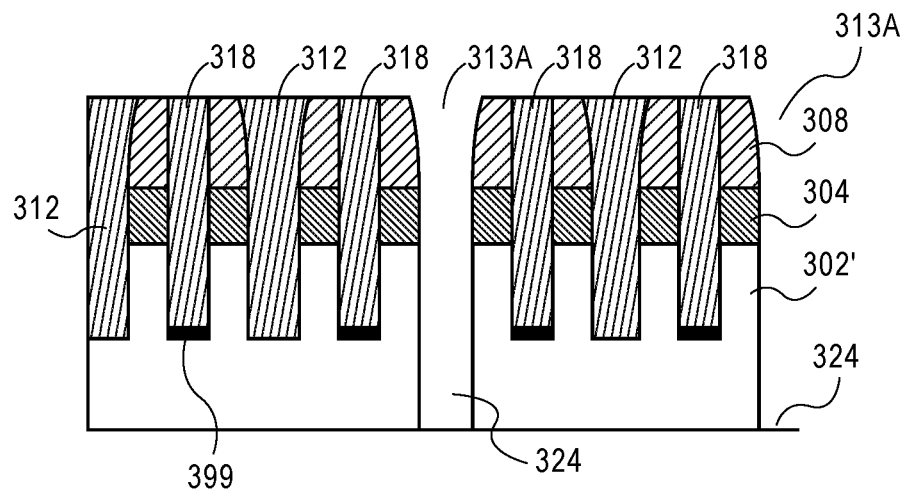

FIG. 3F illustrates the structure of FIG. 3E following etching to form via locations, in accordance with an embodiment of the present invention. Referring to FIG. 3F, the pattern of the via openings 313A are subjected to a selective etch process, such as a selective plasma etch process, to extend the via openings deeper into the underlying ILD layer 302, forming via patterned ILD layer 302' with via locations 324. The etching is selective to remaining photobuckets 312 and 318 and to the spacers 308.

Figure 3G:
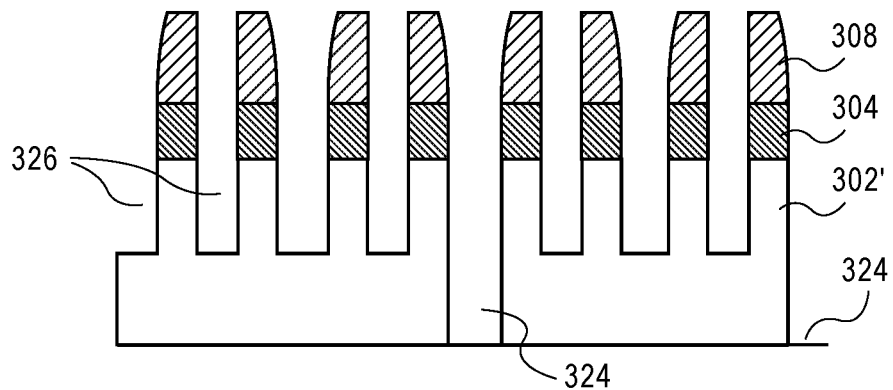

FIG. 3G illustrates the structure of FIG. 3F in preparation for metal fill, in accordance with an embodiment of the present invention. Referring to FIG. 3G, all remaining first and second photobuckets 312 and 318 are removed. The remaining first and second photobuckets 312 and 318 may be removed directly, or may first be exposed and developed to enable removal. The removal of the remaining first and second photobuckets 312 and 318 provides metal line trenches 326, some of which are coupled to via locations 324 in patterned ILD layer 302'.

Figure 4:
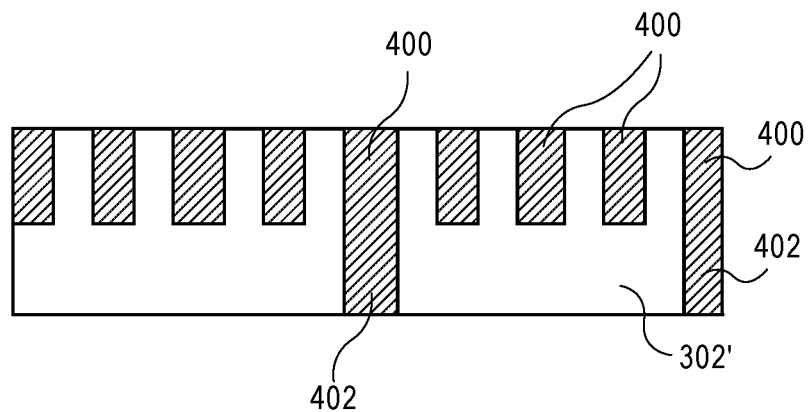
FIG. 4 illustrates a cross-sectional view of the structure of FIG. 3G following metal fill and planarization to provide a metallization layer, in accordance with an embodiment of the present invention.

FIG. 4 illustrates a cross-sectional view of the structure of FIG. 3G following metal fill and planarization to provide a metallization layer, in accordance with an embodiment of the present invention. Referring to FIG. 4, subsequent processing can include removal of spacers 308 and hardmask layer 304, and metal fill of metal line trenches 326 and via locations 324 to form conductive metal lines 400 and conductive vias 402, respectively. In one such embodiment, metallization is formed by a metal fill and polish back process. The structure of FIG. 4 may subsequently be used as a foundation for forming subsequent metal line/via and ILD layers. Alternatively, the structure of FIG. 4 may represent the final metal interconnect layer in an integrated circuit. It is to be appreciated that the above process operations may be practiced in alternative sequences, not every operation need be performed and/or additional process operations may be performed. Referring again to FIG. 4, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Additionally, it is to be appreciated that the approaches described in association with FIGS. 3A-3G and 4 are not necessarily performed as forming vias aligned to an underlying metallization layer. As such, in some contexts, these process schemes could be viewed as involving blind shooting in the top down direction with respect to any underlying metallization layers. In another aspect, a subtractive approach provides alignment with an underlying metallization layer. Furthermore, a grafted resist-inhibitor and associated inhibited resist portion may be retained as a portion of an inter-layer dielectric of a metallization layer. As an example of both such aspects, FIGS. 5A-5I illustrate portions of integrated circuit layers representing various operations in a method of subtractive self-aligned via patterning using photobuckets with selective grafting, in accordance with another embodiment of the present invention. In each illustration, at each described operation, an angled three-dimensional cross-section view is provided.

Figure 5A:
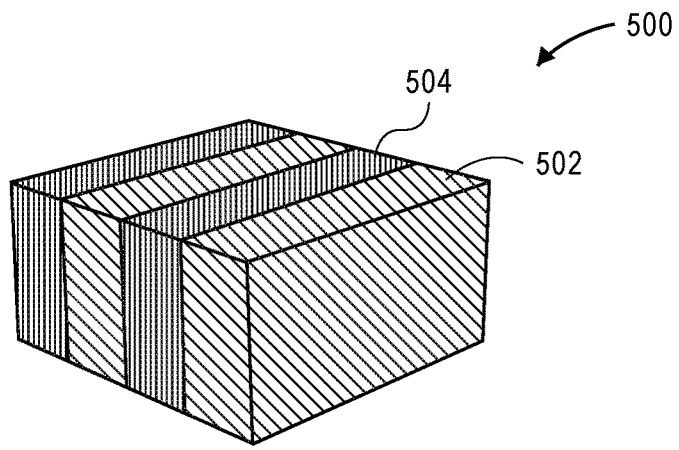
FIGS. 5A-5I illustrate portions of integrated circuit layers representing various operations in a method of subtractive self-aligned via patterning using photobuckets with selective grafting, in accordance with another embodiment of the present invention, where.

FIG. 5A illustrates a starting point structure 500 for a subtractive via process following deep metal line fabrication, in accordance with an embodiment of the present invention. Referring to FIG. 5A, structure 500 includes metal lines 502 with intervening interlayer dielectric (ILD) lines 504. It is to be appreciated that some of the lines 502 may be associated with underlying vias for coupling to a previous interconnect layer. In an embodiment, the metal lines 502 are formed by patterning trenches into an ILD material (e.g., the ILD material of lines 504). The trenches are then filled by metal and, if needed, planarized to the top of the ILD lines 504. In an embodiment, the metal trench and fill process involves high aspect ratio features. For example, in one embodiment, the aspect ratio of metal line height (h) to metal line width (w) is approximately in the range of 5-10.

Figure 5B:
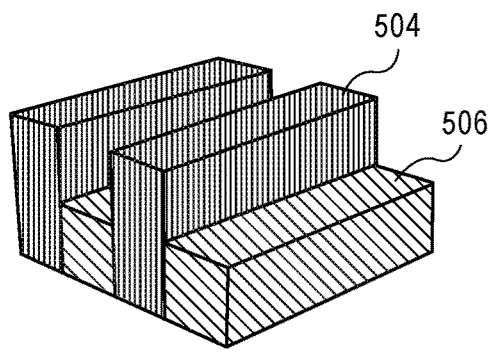

FIG. 5B illustrates the structure of FIG. 5A following recessing of the metal lines, in accordance with an embodiment of the present invention. Referring to FIG. 5B, the metal lines 502 are recessed selectively to provide first level metal lines 506. The recessing is performed selectively to the ILD lines 504. The recessing may be performed by etching through dry etch, wet etch, or a combination thereof. The extent of recessing may be determined by the targeted thickness of the first level metal lines 506 for use as suitable conductive interconnect lines within a back end of line (BEOL) interconnect structure.

Figure 5C:
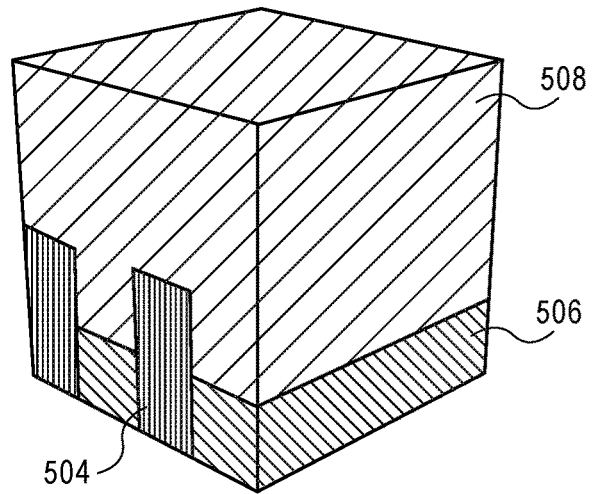

FIG. 5C illustrates the structure of FIG. 5B following formation of an inter layer dielectric (ILD) layer, in accordance with an embodiment of the present invention. Referring to FIG. 5C, an ILD material layer 508 is deposited and, if necessary, planarized, to a level above the recessed metal lines 506 and the ILD lines 504.

Figure 5D:
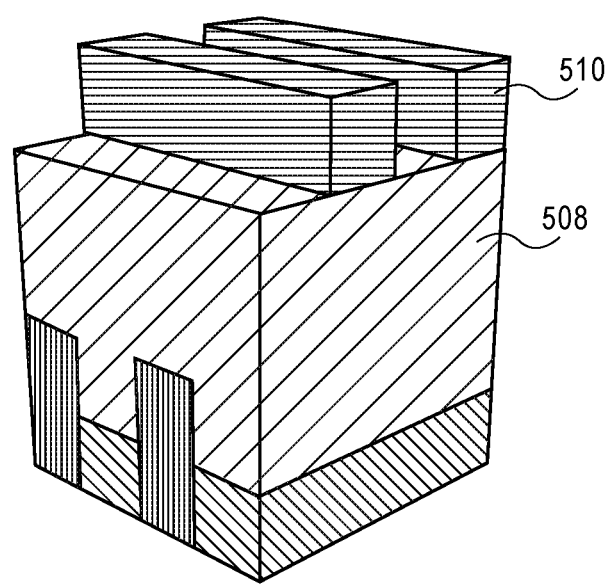

FIG. 5D illustrates the structure of FIG. 5C following deposition and patterning of a hardmask layer, in accordance with an embodiment of the present invention. Referring to FIG. 5D a hardmask layer 510 is formed on the ILD layer 508. In one such embodiment, the hardmask layer 510 is formed with a grating pattern orthogonal to the grating pattern of the first level metal lines 506/ILD lines 504, as is depicted in FIG. 5D. In an embodiment, the grating structure formed by the hardmask layer 510 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 510 of FIG. 5D may have hardmask lines spaced at a constant pitch and having a constant width.

Figure 5E:
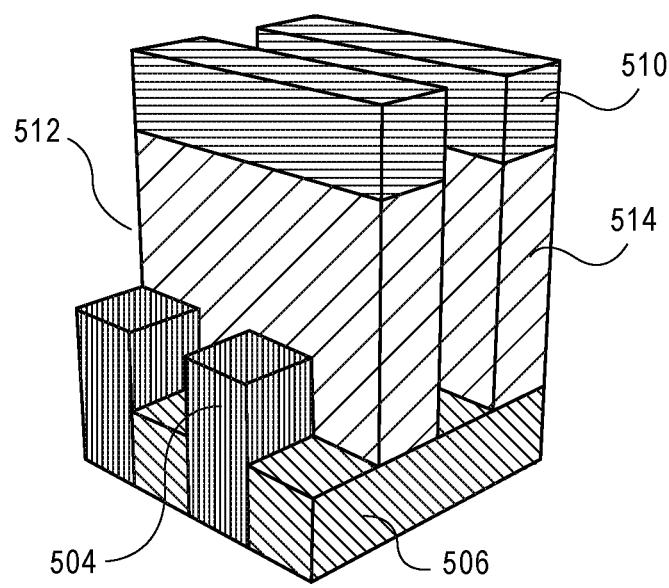

FIG. 5E illustrates the structure of FIG. 5D following trench formation defined using the pattern of the hardmask of FIG. 5D, in accordance with an embodiment of the present invention. Referring to FIG. 5E, the exposed regions (i.e., unprotected by 510) of the ILD layer 508 are etched to form trenches 512 and patterned ILD layer 514. The etch stops on, and thus exposes, the top surfaces of the first level metal lines 506 and the ILD lines 504.

Figure 5F:
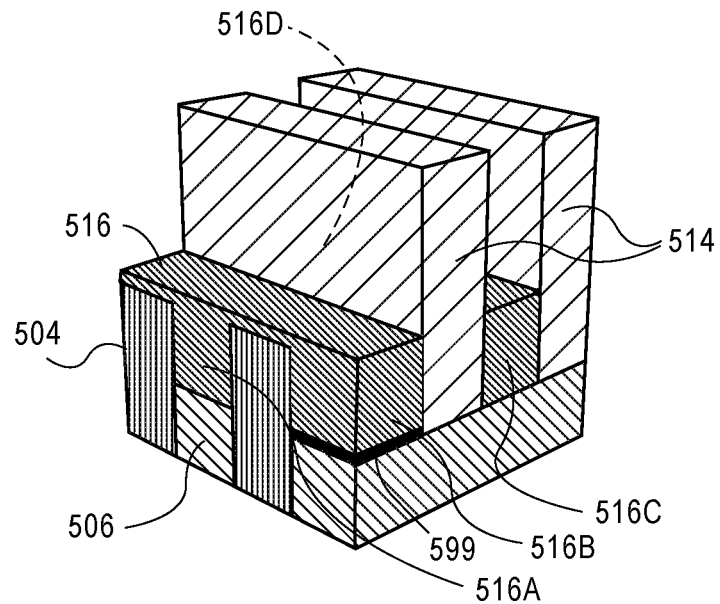

FIG. 5F illustrates the structure of FIG. 5E following photobucket formation in all possible via locations, in accordance with an embodiment of the present invention. Referring to FIG. 5F, a grafted resist-inhibitor layer 599 is included in alternating locations of all possible via locations. A photoresist 516 is then formed in all possible via locations above exposed portions of the recessed metal lines 506. The photoresist material 516 includes photobucket location, of which locations 516A, 516B and 516C are depicted in FIG. 5F. Thus, three different possible via locations 516A, 516B and 516C can be seen in the view provided in FIG. 5F. In one embodiment, the photoresist 516 is formed above and over the top surfaces of the ILD lines 504, as is depicted in FIG. 5F. Additionally, referring again to FIG. 5F, the hardmask layer 510 may be removed from the patterned ILD layer 514.

Figure 5G:
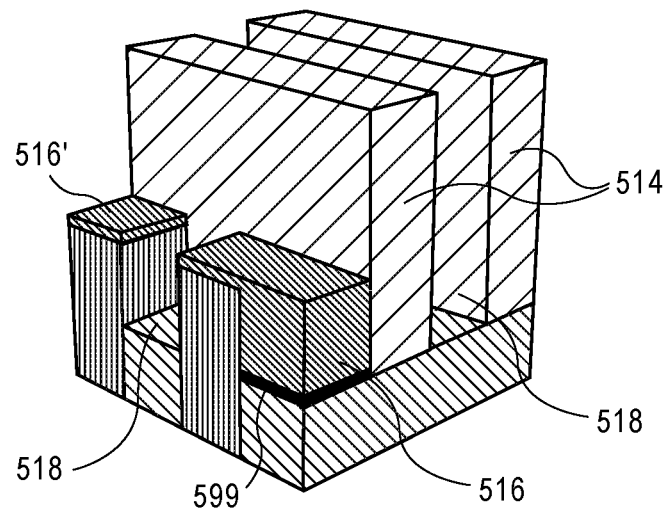

FIG. 5G illustrates the structure of FIG. 5F following via location selection, in accordance with an embodiment of the present invention. Referring to FIG. 5G, the photobuckets 516A and 516C from FIG. 5F in select via locations 518 are removed (i.e., photobuckets 516A and 516C are removed). In locations where vias are not selected to be formed, the photoresist 516 is retained (i.e., photobucket 516B remains after the development process) along with residual portions 516'. In one embodiment, photobucket 516B is at least partially exposed during exposure of photobuckets 516A and 516C. However, as described above, since the photobucket 516B is not a select via location, the grafted resist-inhibitor approach enables retention of photobucket 516B.

Figure 5H:
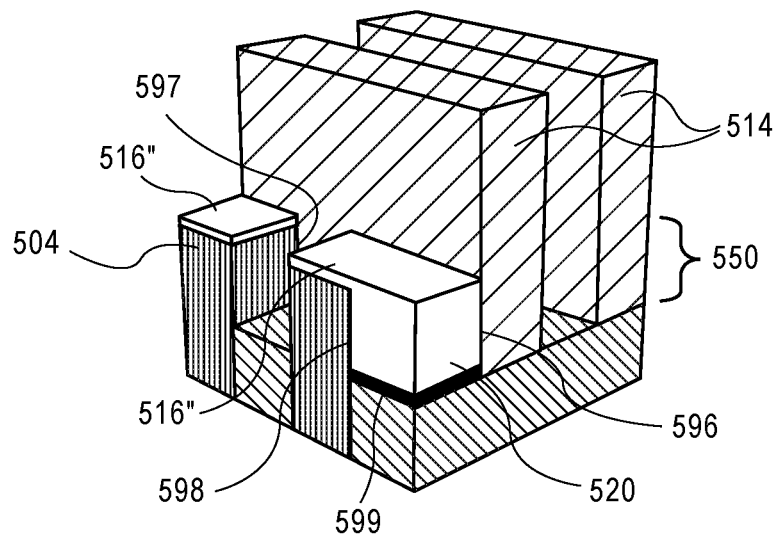

FIG. 5H illustrates the structure of FIG. 5G following conversion of the remaining photobucket material, e.g., photobucket 516B and residual photoresist 516', to permanent ILD material 520 and 516", respectively. Additionally, in an embodiment, the grafted resist-inhibitor layer 599 is retained in the final structure as well. In an embodiment, the material of the remaining photoresist material is modified, e.g., by cross-linking upon a baking operation, and may be referred to as a cross-linked photolyzable material. In one such embodiment, the final, cross-linked material has inter-dielectric properties and, thus, can be retained in a final metallization structure. In an embodiment, the retained resist-inhibitor layer 599 is distinct from the retained cross-linked photolyzable material in that a seam or interface is observable in the final structure. However, in other embodiments, the photobucket material of photobucket 516B is not converted to an ILD material and is instead ultimately removed and replaced with a permanent ILD material.

Referring again to FIG. 5H, in an embodiment, the resulting structure includes up to three different dielectric material regions (ILD lines 504+ILD lines 514+cross-linked photobucket 520, in one embodiment) in a single plane 550 of the metallization structure. In one such embodiment, two or all of ILD lines 504, ILD lines 514, and cross-linked photobucket 520 are composed of a same material. In another such embodiment, ILD lines 504, ILD lines 514, and cross-linked photobucket 520 are all composed of different ILD materials. In either case, in a specific embodiment, a distinction such as a vertical seam between the materials of ILD lines 504 and ILD lines 514 (e.g., seam 597) and/or between ILD lines 504 and cross-linked photobucket 520 (e.g., seam 598) and/or between ILD lines 514 and cross-linked photobucket 520 (e.g., seam 596) may be observed in the final structure.

Figure 5I:
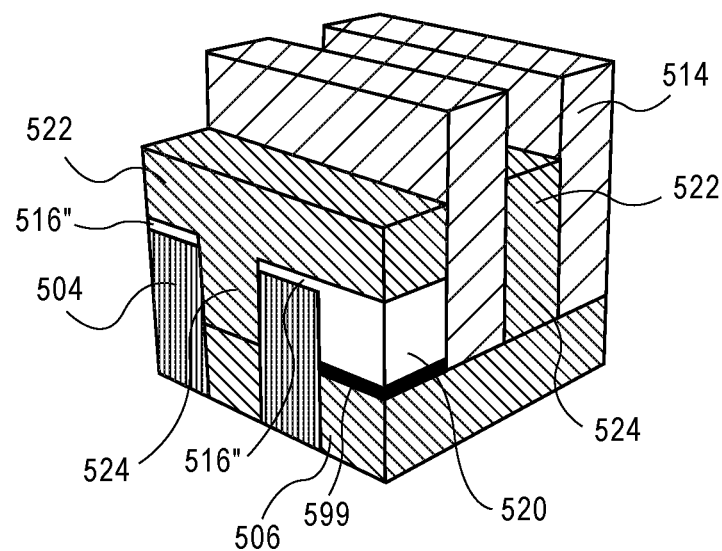

FIG. 5I illustrates the structure of FIG. 5H following metal line and via formation, in accordance with an embodiment of the present invention. Referring to FIG. 5I, metal lines 522 and vias 524 are formed upon metal fill of the openings of FIG. 5H. The metal lines 522 are coupled to the underlying metal lines 506 by the vias 524. In an embodiment, the openings are filled in a damascene approach or a bottom-up fill approach to provide the structure shown in FIG. 5I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 514 may be removed to provide air gaps between the resulting metal lines 524.

The structure of FIG. 5I may subsequently be used as a foundation for forming subsequent metal line/via and ILD layers. Alternatively, the structure of FIG. 5I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 5I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of photobucket interlayer dielectric (ILD) to select locations for plugs or vias, or both plugs and vias. The details above regarding FIGS. 1A-1J, 3A-3G, 4 and 5A-5I focus primarily on photobuckets used for via patterning. However, it is to be appreciated that photobuckets including a selective grating approach may also be used for plug patterning.

In an embodiment, the term "grating structure" or "pitch division" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
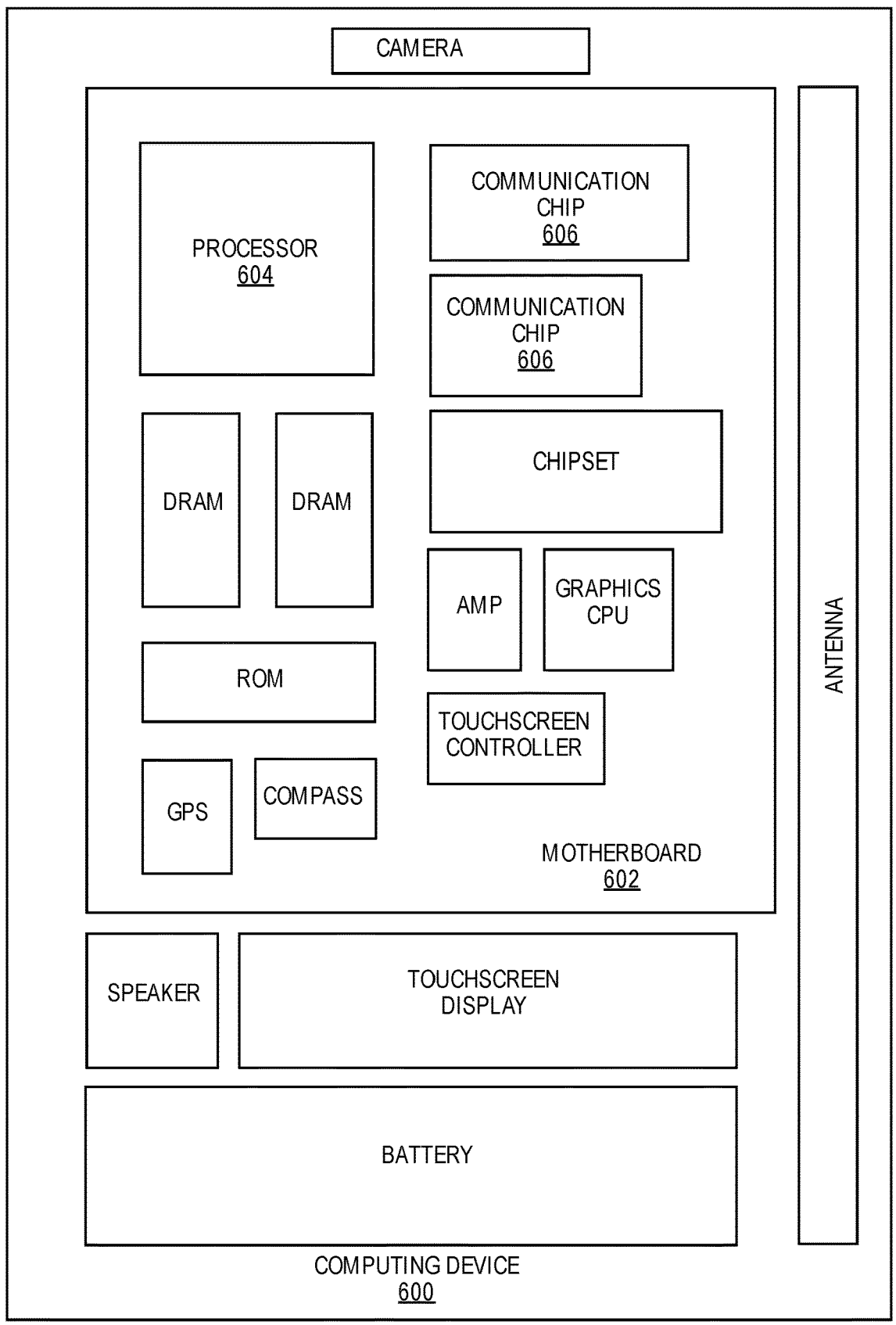
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more structures, such as conductive vias fabricated using an approach based on photobucket floor colors with selective grafting, built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more structures, such as conductive vias fabricated using an approach based on photobucket floor colors with selective grafting, in accordance with embodiments of the invention.

In further implementations, another component housed within the computing device 600 may contain an integrated circuit die that includes one or more structures, such as conductive vias fabricated using an approach based on photobucket floor colors with selective grafting, in accordance with embodiments of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
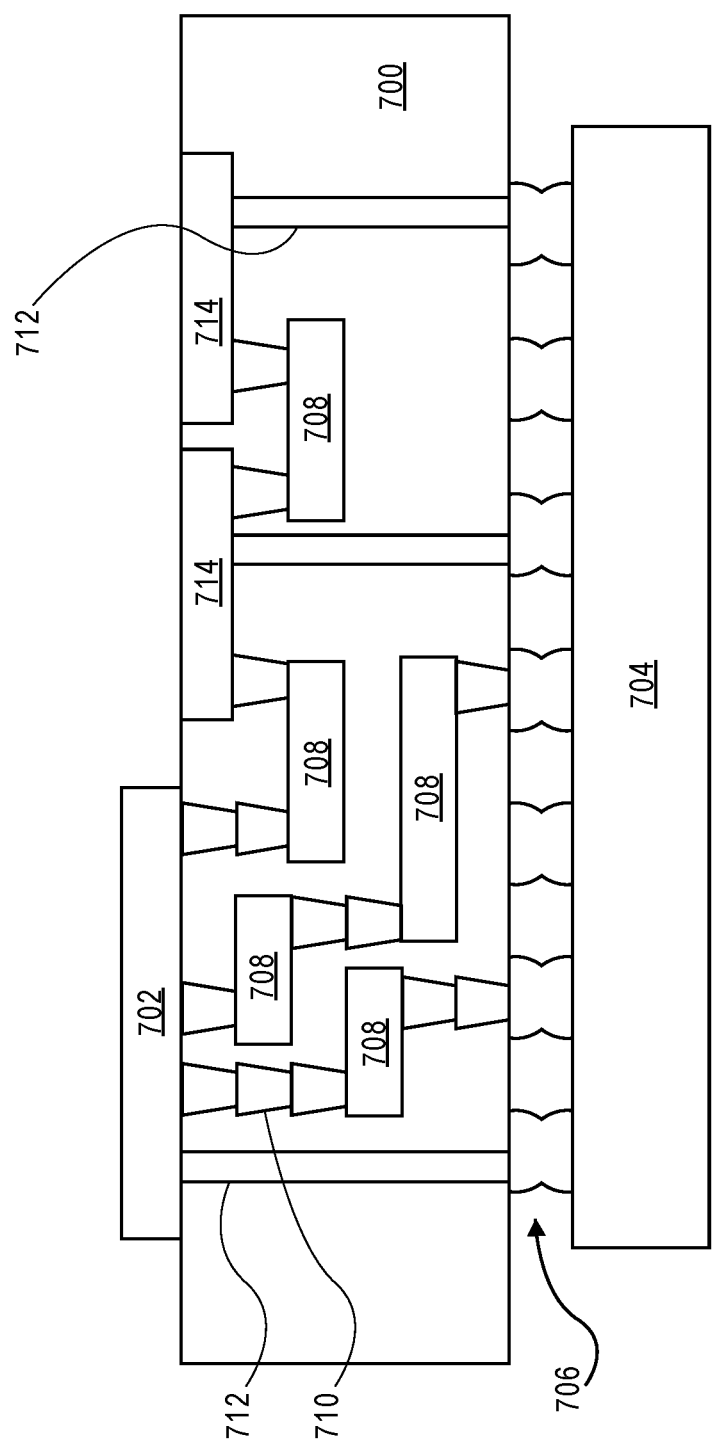
FIG. 7 is an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700 or in one or more of the components of the interposer 700.

Thus, embodiments of the present invention include approaches based on photobucket floor colors with selective grafting for semiconductor structure fabrication, and the resulting structures.

Example Embodiment 1 a method of fabricating an interconnect structure for an integrated circuit including, forming a grating structure above an inter-layer dielectric (ILD) layer formed above a substrate, the grating structure including a plurality of dielectric spacers separated by alternating first trenches and second trenches, grafting a resist-inhibitor layer in the first trenches but not in the second trenches, forming photoresist in the first trenches and in the second trenches, exposing and removing the photoresist in select ones of the second trenches to a lithographic exposure to define a set of via locations, etching the set of via locations into the ILD layer, and subsequent to etching the set of via locations into the ILD layer, and forming a plurality of metal lines in the ILD layer, where select ones of the plurality of metal lines includes an underlying conductive via corresponding to the set of via locations.

Example Embodiment 2 example embodiment 1, wherein the first trenches expose a surface of the ILD layer, and the second set of trenches expose a surface of a patterned hardmask layer formed between the ILD layer and the grating structure.

Example Embodiment 3 example embodiment 1 or 2, wherein the surface of the ILD layer includes Si—OH groups, and the surface of the patterned hardmask layer does not include Si—OH groups.

Example Embodiment 4 example embodiment 1, 2 or 3, wherein the photoresist is a photo-acid generator (PAG)-based photoresist, and wherein grafting the resist-inhibitor layer includes forming a layer having a basic molecule or moiety.

Example Embodiment 5 example embodiment 1, 2, 3 or 4, wherein exposing the photoresist in select ones of the second trenches to the lithographic exposure exposes a portion the photoresist in one or more of the first trenches, but wherein the portion of the photoresist in the one or more of the first trenches is not removed during the removing of the photoresist in the select ones of the second trenches.

Example Embodiment 6 example embodiment 1, 2, 3, 4 or 5, further including, prior to grafting the resist-inhibitor layer, forming a cross-grating structure within the grating structure.

Example Embodiment 7 example embodiment 1, 2, 3, 4, 5, or 6 wherein exposing the select ones of the second trenches to the lithographic exposure includes exposing to extreme ultraviolet (EUV) or e-beam radiation.

Example Embodiment 8 a method of fabricating an interconnect structure for an integrated circuit including forming a mask above an ILD material layer, the mask having a plurality of spaced apart features each with a central portion and a pair of sidewall spacers, forming, using the mask, a first plurality of trenches partially into the ILD material layer, forming a first plurality of photobuckets in the first plurality of trenches, forming a second mask from the mask by removing the central portion of each feature of the mask, forming, using the second mask, a second plurality of trenches partially into the ILD material layer, forming a second plurality of photobuckets in the second plurality of trenches, the second plurality of photobuckets formed on a resist-inhibitor layer, exposing, developing and removing fewer than all of the first plurality of photobuckets by using a lithographic exposure, forming via locations where the fewer than all of the first photobuckets were removed, and forming metal vias in the via locations and metal lines above the metal vias.

Example Embodiment 9 example embodiment 8, wherein the resist-inhibitor layer is selectively grafted on the bottoms of the second plurality of trenches prior to forming the second plurality of photobuckets.

Example Embodiment 10 example embodiment 8 or 9, wherein the first plurality of photobuckets and the second plurality of photobuckets are formed from a same photoresist material.

Example Embodiment 11 example embodiment 8, 9 or 10, wherein the exposing includes at least partially exposing portions of the second plurality of photobuckets, but the developing and removing does not remove the exposed portions of the second plurality of photobuckets.

Example Embodiment 12 example embodiment 8, 9, 10 or 11, wherein the resist-inhibitor layer inhibits removal of the exposed portions of the second plurality of photobuckets.

Example Embodiment 13 example embodiment 8, 9, 10, 11 or 12, wherein the exposing includes exposing to extreme ultraviolet (EUV) or electron beam (e-beam) radiation.

Example Embodiment 14 an interconnect structure for an integrated circuit including a first layer of the interconnect structure disposed above a substrate, the first layer including a first grating of alternating metal lines and dielectric lines in a first direction, wherein the dielectric lines have an uppermost surface higher than an uppermost surface of the metal lines, a second layer of the interconnect structure disposed above the first layer of the interconnect structure, the second layer including a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating, and a region of dielectric material disposed between the metal lines of the first grating and the metal lines of the second grating, and in a same plane as upper portions of the dielectric lines of the first grating and lower portions of the dielectric lines of the second grating, the region of dielectric material including a cross-linked photolyzable material disposed on a distinct resist-inhibitor material layer.

Example Embodiment 15 example embodiment 14, wherein the cross-linked photolyzable material is a photo-acid generator (PAG)-based cross-linked photolyzable material.

Example Embodiment 16 example embodiment 14 or 15, wherein the resist-inhibitor material layer includes a basic molecule or moiety.

Example Embodiment 17 example embodiment 14, wherein the cross-linked photolyzable material is not a photo-acid generator (PAG)-based cross-linked photolyzable material.

Example Embodiment 18 example embodiment 14, 15, 16 or 17, wherein the cross-linked photolyzable material is a negative tone material.

Example Embodiment 19 example embodiment 14, 15, 16, 17 or 18, further including a conductive via disposed between and coupling a metal line of the first grating to a metal line of the second grating, the conductive via in the same plane as the region of dielectric material.

Example Embodiment 20 example embodiment 14, 15, 16, 17, 18 or 19, wherein the conductive via has a center directly aligned with a center of the metal line of the first grating and with a center of the metal line of the second grating.

Example Embodiment 21 example embodiment 14, 15, 16, 17, 18, 19 or 20, wherein the dielectric lines of the first grating include a first dielectric material, and the dielectric lines of the second grating include a second, different dielectric material, and wherein the first and second dielectric materials are different than the cross-linked photolyzable material.

Example Embodiment 22 example embodiment 14, 15, 16, 17, 18, 19, 20 or 21, wherein the dielectric lines of the first grating and the dielectric lines of the second grating include a same dielectric material different than the cross-linked photolyzable material.

What is claimed is:

1. A method of fabricating an interconnect structure for an integrated circuit, the method comprising:
   forming a grating structure above an inter-layer dielectric (ILD) layer formed above a substrate, the grating structure comprising a plurality of dielectric spacers separated by alternating first trenches and second trenches;
   grafting a resist-inhibitor layer in the first trenches but not in the second trenches; forming photoresist in the first trenches and in the second trenches;
   exposing and removing the photoresist in select ones of the second trenches to a lithographic exposure to define a set of via locations; etching the set of via locations into the ILD layer; and
   subsequent to etching the set of via locations into the ILD layer, forming a plurality of metal lines in the ILD layer, where select ones of the plurality of metal lines includes an underlying conductive via corresponding to the set of via locations.

2. The method of claim 1, further comprising:
   prior to forming the grating structure above the ILD layer, forming a patterned hardmask layer above the ILD layer, wherein the grating structure is formed above the patterned hardmask layer, wherein the first trenches expose a surface of the ILD layer, and the second set of trenches expose a surface of the patterned hardmask layer.

3. The method of claim 2, wherein the surface of the ILD layer includes Si—OH groups, and the surface of the patterned hardmask layer does not include Si—OH groups.

4. The method of claim 1, wherein the photoresist is a photo-acid generator (PAG)-based photoresist, and wherein the resist-inhibitor layer comprises a layer having a basic molecule or moiety.

5. The method of claim 1, wherein exposing the photoresist in select ones of the second trenches to the lithographic exposure exposes a portion the photoresist in one or more of the first trenches, but wherein the portion of the photoresist in the one or more of the first trenches is not removed during the removing of the photoresist in the select ones of the second trenches.

6. The method of claim 1, further comprising:
   prior to grafting the resist-inhibitor layer, forming a cross-grating structure within the grating structure.

7. The method of claim 1, wherein exposing the select ones of the second trenches to the lithographic exposure comprises exposing to extreme ultraviolet (EUV) or e-beam radiation.

8. A method of fabricating an interconnect structure for an integrated circuit, the method comprising:
   forming a mask above an ILD material layer, the mask having a plurality of spaced apart features each with a central portion and a pair of sidewall spacers;
   forming, using the mask, a first plurality of trenches partially into the ILD material layer;
   forming a first plurality of photobuckets in the first plurality of trenches;
   forming a second mask from the mask by removing the central portion of each feature of the mask;
   forming, using the second mask, a second plurality of trenches partially into the ILD material layer; forming a second plurality of photobuckets in the second plurality of trenches, the second plurality of photobuckets formed on a resist-inhibitor layer;
   exposing, developing and removing fewer than all of the first plurality of photobuckets by using a lithographic exposure;
   forming via locations where the fewer than all of the first photobuckets were removed; and
   forming metal vias in the via locations and metal lines above the metal vias.

9. The method of claim 8, wherein the resist-inhibitor layer is selectively grafted on the bottoms of the second plurality of trenches prior to forming the second plurality of photobuckets.

10. The method of claim 8, wherein the first plurality of photobuckets and the second plurality of photobuckets are formed from a same photoresist material.

11. The method of claim 8, wherein the exposing comprises at least partially exposing portions of the second plurality of photobuckets, but the developing and removing does not remove the exposed portions of the second plurality of photobuckets.

12. The method of claim 11, wherein the resist-inhibitor layer inhibits removal of the exposed portions of the second plurality of photobuckets.

13. The method of claim 8, wherein the exposing comprises exposing to extreme ultraviolet (EUV) or electron beam (e-beam) radiation.

14. An interconnect structure for an integrated circuit, the interconnect structure comprising:
   a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
   a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact the dielectric lines of the first grating; and a region of dielectric material disposed between the metal lines of the first grating and the metal lines of the second grating, and in a same plane as upper portions of the dielectric lines of the first grating and lower portions of the dielectric lines of the second grating, the region of dielectric material comprising a cross-linked photolyzable material disposed on a distinct resist-inhibitor material layer.

15. The interconnect structure of claim 14, wherein the cross-linked photolyzable material is a photo-acid generator (PAG)-based cross-linked photolyzable material.

16. The interconnect structure of claim 15, wherein the resist-inhibitor material layer comprises a basic molecule or moiety.

17. The interconnect structure of claim 14, wherein the cross-linked photolyzable material is a negative tone material.

18. The interconnect structure of claim 14, further comprising:
   a conductive via disposed between and coupling a metal line of the first grating to a metal line of the second grating, the conductive via in the same plane as the region of dielectric material.

19. The interconnect structure of claim 18, wherein the conductive via has a center directly aligned with a center of the metal line of the first grating and with a center of the metal line of the second grating.

20. The interconnect structure of claim 14, wherein the dielectric lines of the first grating comprise a first dielectric material, and the dielectric lines of the second grating comprise a second, different dielectric material, and wherein the first and second dielectric materials are different than the cross-linked photolyzable material.

21. The interconnect structure of claim 14, wherein the dielectric lines of the first grating and the dielectric lines of the second grating comprise a same dielectric material different than the cross-linked photolyzable material.

\* \* \* \* \*